United States Patent [19]
Lin et al.

[11] Patent Number: 6,028,790
[45] Date of Patent: Feb. 22, 2000

[54] METHOD AND DEVICE FOR PROGRAMMING A NON-VOLATILE MEMORY CELL BY CONTROLLING SOURCE CURRENT PULLDOWN RATE

[75] Inventors: Chin-Hsi Lin, Ching Chao Hu; Ful-Long Ni; Mam-Tsung Wang, both of Hsinchu, all of Taiwan

[73] Assignee: Macronix International Co., Ltd., Hsinchu, Taiwan

[21] Appl. No.: 09/227,024

[22] Filed: Jan. 7, 1999

[51] Int. Cl.[7] .................................................. G11C 16/00
[52] U.S. Cl. ............................... 365/185.18; 365/185.28; 365/189.09
[58] Field of Search .................... 365/185.18, 185.25, 365/185.28, 189.01, 189.09

[56] References Cited

U.S. PATENT DOCUMENTS

| | | | |
|---|---|---|---|
| 5,042,009 | 8/1991 | Kazerounian et al. | 365/185 |
| 5,590,070 | 12/1996 | Harrand et al. | 365/149 |
| 5,608,676 | 3/1997 | Medlock et al. | 365/189.09 |
| 5,712,815 | 1/1998 | Bill et al. | 365/185.03 |
| 5,959,892 | 9/1999 | Lin et al. | 365/185.28 |

*Primary Examiner*—Tan T. Nguyen
*Attorney, Agent, or Firm*—Haynes & Beffel LLP

[57] ABSTRACT

A method and apparatus for programming a non-volatile memory cell wherein the rate of current flowing through the cell is controlled via a current limiter coupled to the source node of the memory cell. The rate of current through the current limiter controls the programming current rate through the memory cell. The current limiter is controlled by an input which is dependant upon the setting of a current through an associated current mirror device. The current mirror current is controlled by a pre-defined input condition on a current source. The mirror current is used by a biasing circuit to generate a proportional input to the current limiter device. The current source thereby controls the current limiter rate. The current source can be formed from the same process as the memory cells and its output will thereby vary with the conductivity of the formed devices. This variation in the current source output, and hence the current limiter current, can be used to compensate for the comparable conductivity variations in the memory cells. The programming current rate can thereby be controlled, and can additionally be controlled according to process variations in the memory cell devices.

13 Claims, 3 Drawing Sheets

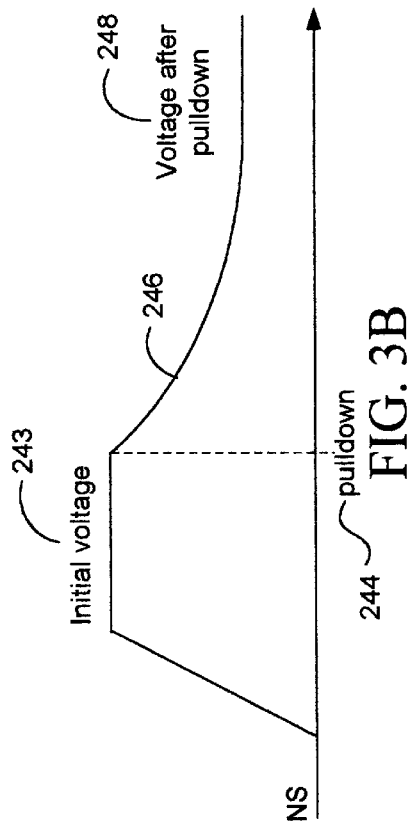
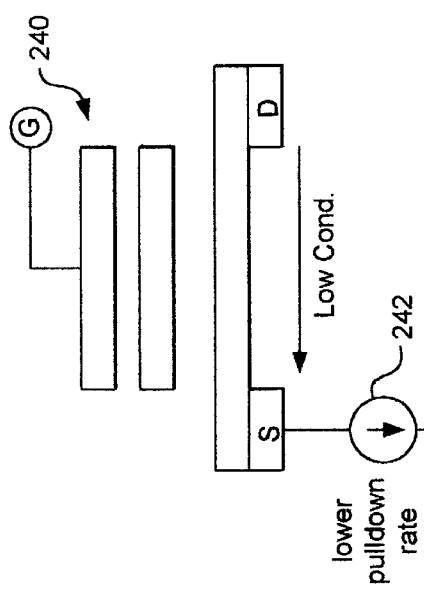
FIG. 3A
FIG. 3B
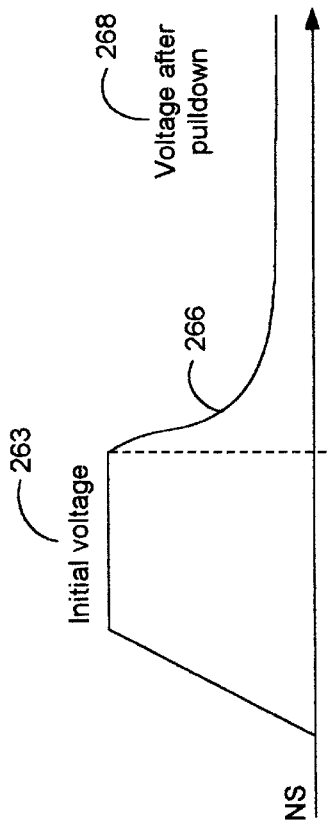
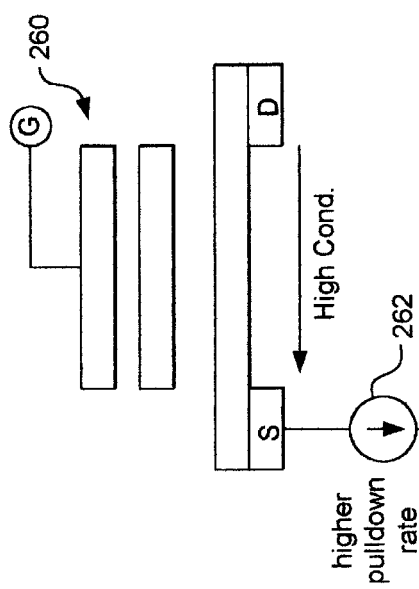
FIG. 4A
FIG. 4B

METHOD AND DEVICE FOR PROGRAMMING A NON-VOLATILE MEMORY CELL BY CONTROLLING SOURCE CURRENT PULLDOWN RATE

BACKGROUND OF THE INVENTION

1. Field of the Invention

The present invention relates to a memory cell circuitry device, and more particularly to a method of programming a non-volatile memory cell. The programming current is controlled through use of current pulldown circuitry at the source gate of the cell. The pulldown circuitry is rate controllable, and can also be configured to vary the rate in order to compensate for device process variations.

2. Description of Related Art

Non-volatile memory cells include devices such as CMOS, NMOS, and bipolar transistor devices which are configured to perform as EPROMs (Electrically Programmable Read Only Memories) and EEPROMs (Electrically Erasable Programmable Read Only Memories). The storage transistor used in a memory cell is typically a variation of an NMOS transistor wherein the cell stores charge on a section of polysilicon which is floating in an area of silicon dioxide above the P-substrate material of the device. This floating area, referred to as a floating gate, is located between the P-substrate material, which includes a drain and source gate, and a control gate. The silicon dioxide is typically about 8 to 12 nanometers thick and insulates the floating gate polysilicon from the control gate above the N-channel device.

An electrically induced avalanche injection mechanism is used to charge the floating gate with electrons from the substrate. A current is induced to flow through the substrate by application of a high voltage across the drain and source gates of the device. As this current flows, various hot electrons will jump from the substrate material to the floating gate thereby creating a useful charge on the device. This charge is then retained until it is discharged by various techniques including, for instance, application of ultraviolet light or X-rays, or formation and use of electrical tunneling effects (e.g. Fowler-Nordheim tunneling mechanism).

In applying a voltage across the substrate, if the voltage is too high, the related adverse effects such a punchthrough and drain-turn-on will impact the reliability and predictability of programming the memory device. In actual product configurations, there are typically other cells arranged in parallel with the programming cell. Such arrangements may further cause the adverse effects to get more severe and make the programming current larger than desired, which is inefficient. Such concerns are even more prevalent as the size of the memory cell devices shrink and the substrate thicknesses decrease. A thinner substrate and related layers are more susceptible to damage from excessive programming currents.

Still another concern with present devices is the ability to have sufficient current available to program the device. A trend today is create devices which use less power, and thereby may only contain a single power supply for a multi-cell array or configuration. An internal high voltage is created via a charge pumping circuit, and is thereafter coupled to the drain gate of the memory device to achieve the necessary voltage drop across the drain and source gates. Without a sufficient voltage, the memory device cannot be adequately programmed.

For any given voltage across the cell, the current flow through the device will be affected by the relatively conductivity of the cell. Such conductivity will be affected by process variations in forming the cell. While manufacturers strive for known results and conformity in the formation of devices, process variations are inevitable to some degree, and expensive to control. If, for instance, the overall process variations in forming the device produce a higher conductivity, then a higher programming current will be created across the device upon the application of a given voltage. An unpredictably high current can produce punch through and like problems mentioned above. On the other hand, if process variations produce a lower conductivity, then a lower programming current will be created upon application of the same given voltage. Unpredictably lower currents can lead to ineffective programming of the cell.

Prior attempts have been made at biasing a memory cell circuit to compensate for device processing characteristics. In U.S. Pat. No. 5,218,571, a circuit is provided which uses a process dependant voltage reference generator during the programming cycle. When the transistor conductivity is low, a lower source voltage is set. This serves to increase the drain-to-source voltage drop, and thereby increases the resulting programming current through the cell. Conversely, when the transistor conductivity is high, a higher source voltage is set which serves to decrease the drain-to-source differential, and thereby decreases the resulting current. This solution, however, does not serve to control the rate of the programming current. The reference voltage is set to a certain level, dependant upon process variations, and held at that level in order to program the memory cell device.

Accordingly, what is needed in this field is a method and apparatus which allows for a controlled rate of programming a memory cell. As programming conditions are applied to a memory cell, the programming current should be controllable at a slow enough rate as to prevent hot electron effects such as punch through. The programming current should also be variable, as needed in order to achieve the current rate programming goal, and also be responsive to device process variations.

SUMMARY OF THE INVENTION

According to the present invention, a non-volatile memory cell device, and method of programming the device, are provided which allows for a controlled rate of current flow through the memory cell device as it is being programmed. The device circuit includes a current limiter comprised of a transistor device which is connected to the source of the memory cell to be programmed. The device circuitry also includes a current mirror device which is connected to an EPROM miniarray at its drain node. The miniarray is used to control, or pre-define, the amount of current flowing through the mirror device. The mirror device is further connected to a biasing circuit which produces a gate voltage, the gate voltage being mirrored from the pre-defined current. This gate voltage is connected to the gate of the current limiter transistor device at the source of the memory cell. Additionally, a high voltage source is connected to the drain node of the memory cells in order to generate the drain-to-source voltage differential needed for programming. The memory cells are selectively programmed via switching lines which provide access to individual cells.

To program each memory cell device, the device is first switchably selected via memory block, column, and row select lines. The drain and source nodes for the cell are thereafter connected to a high voltage level simultaneously, in order to make the drain-to-source voltage of programmed cell small, or non-existent. At the same time, the gate of the programmed cell is coupled to a certain voltage level. Afterward, the voltage of the source node of the cell is pulled down by the current limiter, with the pulldown rate being controlled by pre-defined current set by the current mirror and miniarray. During this pulldown phase, the current flowing through the programmed cell is limited by the current limiter, which prevents detrimental hot electron effects. When the drain-to-source voltage reaches a large enough differential, programming of the cell will commence. Finally after pull-down of the voltage on the source side, the gate of the programming cell is coupled directly to a final voltage level, or alternatively to a time-dependant function (e.g. a ramp signal).

Accordingly, one aspect of the present invention is to provide device circuitry for programming a memory cell device which will control or limit the programming current through the memory cell in order to prevent detrimental hot electron effects.

Another aspect of the present invention is to provide device circuitry for maintaining adequate and/or non-excessive programming current through the memory cell, even if process variations result in higher or lower cell conductivity.

Still another aspect of the present invention is to provide a circuit which results in a lower source pulldown current and higher source voltage if the cell conductivity is relatively low.

Yet another related aspect of the present invention is to provide a circuit which results in a higher source pulldown current and lower source voltage if the cell conductivity is relatively high.

Still another aspect of the present invention is to provide a programming method which utilizes the aforementioned circuitry and thereby limits the memory cell current according to a controlled rate during programming, the rate being set by a pre-defined current through a current mirror device.

Other aspects and advantages of the present invention can be seen upon review of the figures, the detailed description and the claims which follow.

BRIEF DESCRIPTION OF THE FIGURES

FIG. 3(a) is a circuit diagram showing a device with a low cell conductivity and a correspondingly lower pulldown rate applied to the source node of the device.

FIG. 3(b) is a diagram of the device source voltage NS showing the effects of the relatively lower pulldown rate at the source node of the device.

FIG. 4(a) is a circuit diagram showing a device with a high cell conductivity and a correspondingly higher pulldown rate applied to the source node of the device.

FIG. 4(b) is a diagram of the device source voltage NS showing the effects of a relatively higher pulldown rate at the source node of the device.

DETAILED DESCRIPTION

Figure 1:
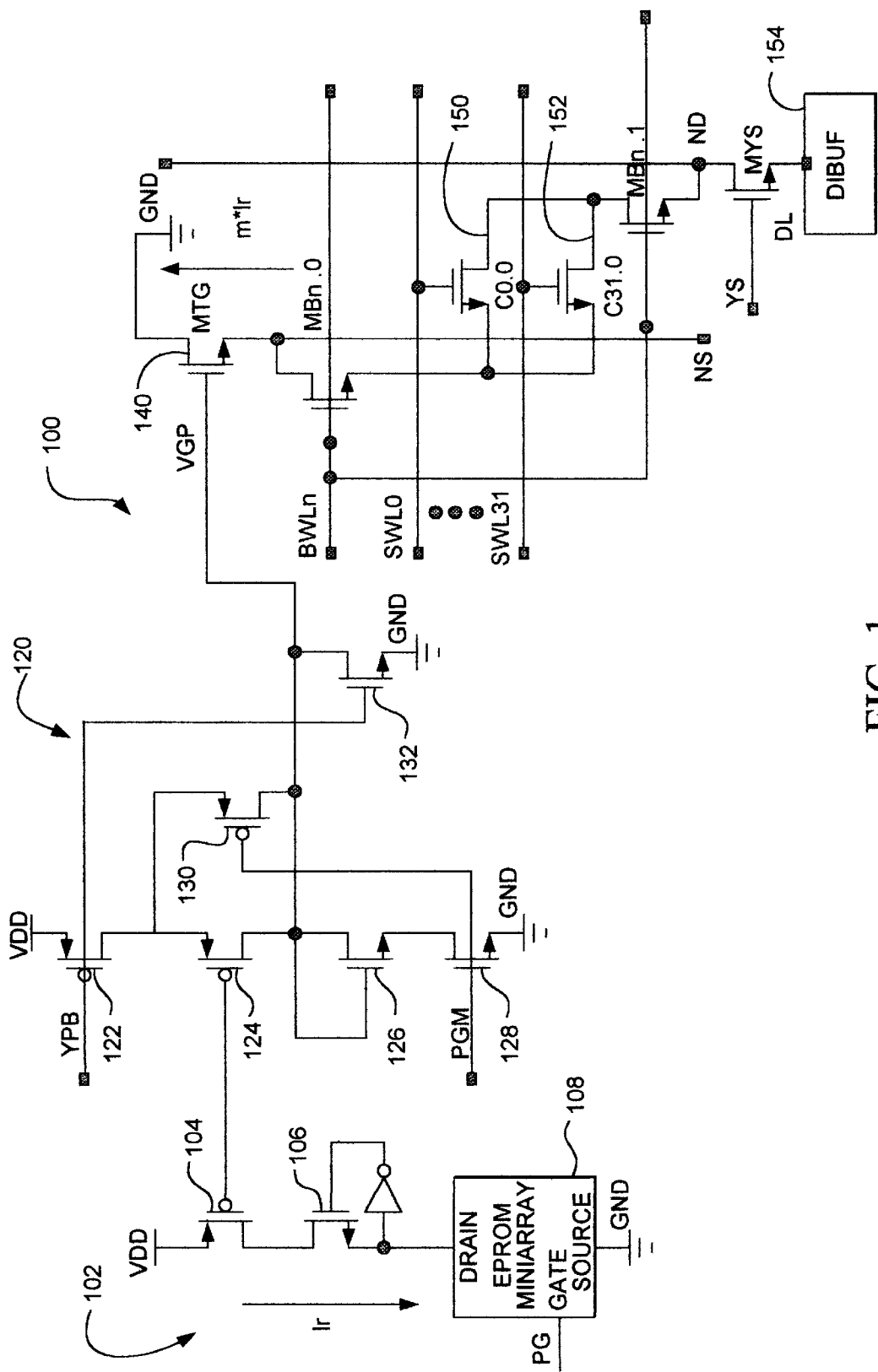
FIG. 1 is a circuit diagram of the memory cell device showing the switching lines for selecting the memory cell to be programmed, the current limiter on the source node, a biasing circuit for generating a biasing voltage to control the current limiter, a current mirror with a pre-defined current for setting the biasing voltage, and a miniarray for setting the pre-defined current.
Figure 2:
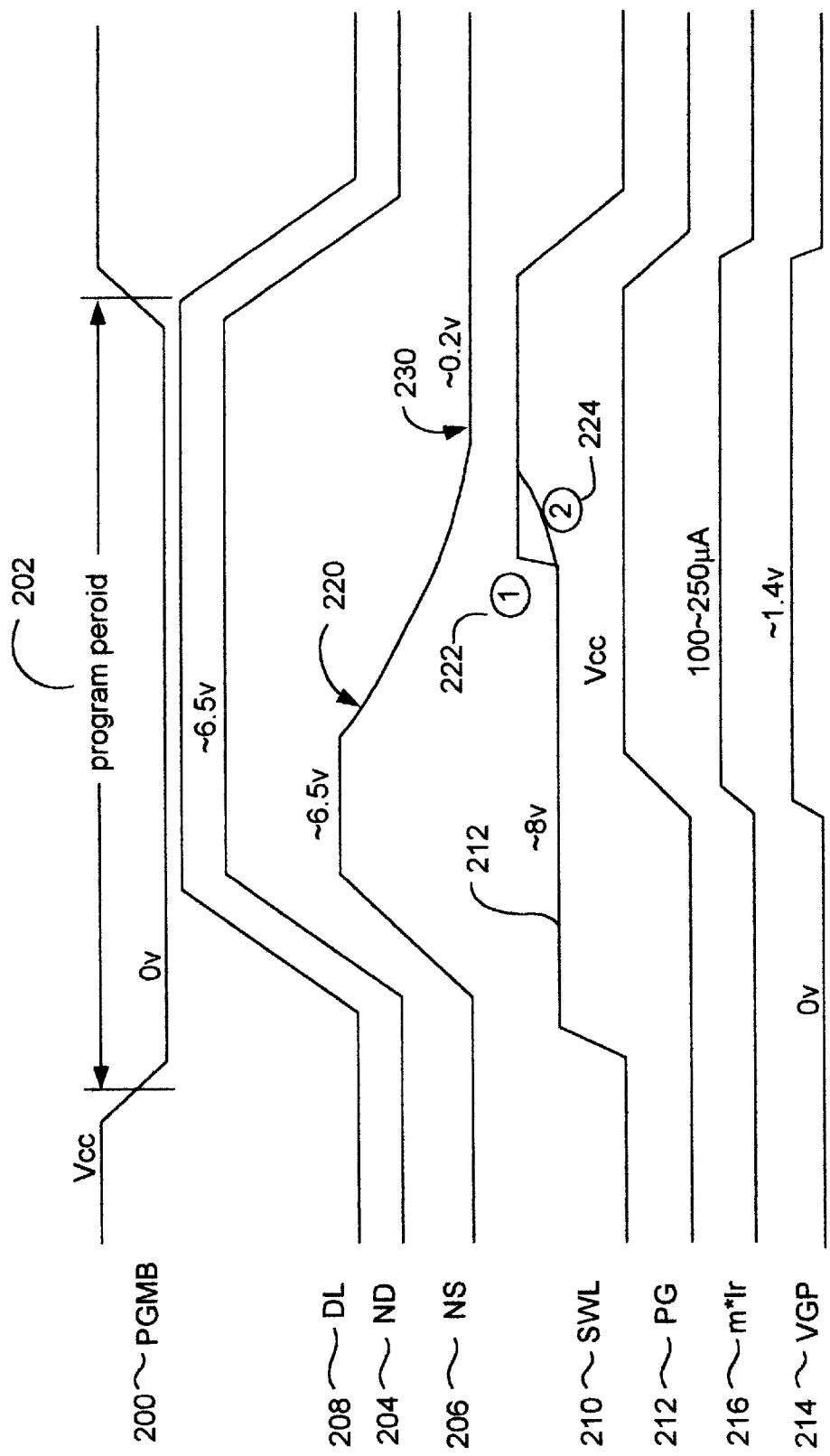
FIG. 2 is a timing diagram showing the voltages and resulting currents at various nodes on the circuit of FIG. 1 during the programming procedure.

A detailed description of the present invention is provided with respect to FIGS. 1–2. In FIG. 1, a circuit diagram 100 is shown which details the interconnections of the devices of the present invention which serve to provide a controlled rate of current through the memory cell during certain programming steps. A current mirror 102 is provided and is comprised of P and N-type MOS transistor devices 104 and 106 configured as shown and connected to a voltage supply source VDD and an EPROM miniarray 108. The miniarray 108 serves as a current source and includes a drain node which is coupled to the current mirror 102, a source node connected to ground, and a gate node which is supplied with a gate voltage PG. The level of the gate voltage PG defines the level of current Ir which flows through the current mirror 102.

The memory cells 150, 152 are arranged in blocks and are selected for individual programming via block, row, and column selection lines. Two memory cells are shown, also labeled as c0,0 and c31,0 which indicates that these representative example cells are arranged in rows of 32. The switching wordlines labeled SWL0 and SWL31 are used to program the individual gates of the selected memory cells. The switching line BWLn and the transistor devices MBn,0 and MBn,1 are shown as representative devices for selecting the memory cell block. The transistor device MYS is used to select the respective memory cell column. A high voltage source 154 (also labeled DIBUF) is connected to through the column selection device MYS to the drain side of the memory cells, the source 154 serving to set the dataline (DL) to high during programming. The DIBUF element also serves as a data input buffering device.

The current mirror 102 is coupled to a biasing circuit 120. Circuit 120 is comprised of P and N-type MOS transistor devices 122–132 configured as shown and coupled to supply voltage VDD and ground. Circuit 120 serves to provide the biasing voltage VGP which mirrors the level of the defined current Ir from the current mirror 102. VGP is used as the input to the gate of a current limiter transistor device 140 (also labeled as MTG), which is connected to the source side of the memory cells via the network of switching lines described above. In operation, the current through the current limiter 140 will be a constant function of the current Ir through the mirror device 102 (e.g. a constant m times the current Ir, or m*Ir). Given that the current limiter 140 will serve to pull down the source side of a selected memory cell (150 or 152), the current m*Ir with serve to control the rate of the current flowing through the memory cell which is being programmed. As VGP is varied, the value of m*Ir is also varied. Hence, by controlled and/or defining the current through the current mirror 102, the source pulldown rate on the memory cell is also controlled. This pulldown rate serves to control the programming current flow through the memory cell.

Referring also now to FIG. 2, a representative timing diagram is shown for various input lines or nodes of the device 100 from FIG. 1. A program enabling signal 200 is shown with a program period 202. To program the device 100, the following method can be used: First, a high voltage is applied to both the source and drain nodes, shown as signals ND (204) and NS (206) respectively, in order to minimize to the drain-to-source voltage across the selected memory cell (e.g. 0–31 as selected above). Immediately thereafter, the voltage source 154 is used to couple the dataline DL shown as signal 208, and hence the drain node ND, to a high voltage level. In such instance, the example the voltage applied is approximately 6.5 volts. A voltage is thereafter applied to the gate node of the selected cell via the SWL wordline (SWL0 through SWL31), shown in FIG. 2 as signal 210. During this initial programming period, the example voltage applied (212) is approximately 8 volts.

Thereafter, the source side of the selected memory cell is pulled down at a controlled, and relatively slow, rate by the current limiter 140. As shown by signal 212, a known reference voltage Vcc is applied to applied to the gate node PG of the EPROM miniarray 108. This causes a defined current Ir to flow through the current mirror 102. The coupled biasing circuit 120 provides a voltage signal VGP which directly mirrors the level of the current Ir.

Shown as signal 214, VGP has a level of approximately 1.4 volts. The signal VGP is coupled to the gate input node of the current limiter device 140. VGP turns on the limiter and causes a current equal to m*Ir to flow, this signal shown as 216 with a level of approximately 100–250 microamps. At the moment of application, shown as 218, the current limiter serves to pulldown the source node of the memory cell, shown as 220. By controlling the level of the current mirror current Ir, the rate of the pulldown as shown in the sloping curve 220 can be controlled to be a relatively slow rate. At some point along the curve 220, the voltage differential between the drain-to-source of the memory cell will be large enough for programming of the memory cell to occur. The wordline SWL of the memory cell is thereafter connected to a final level which could be either: (1) a stepped up level from the previous SWL voltage, as shown by step 222; or (2) a time-dependant, or ramped up level from the previous SWL voltage, as shown by ramp 224. While both will provide adequate programming of the cell, the time-dependant function serves to provide additional programming efficiency.

The overall cell conductivity of the memory devices can affect programmability and can lead to unexpected hot electron effects if improper voltages are applied for certain conductivity conditions. Accordingly, the pulldown rate of the current limiter can be configured to compensate for conductivity variations. In the present invention, the EPROM miniarray 108 can be formed from the same process as the memory cells, thereby making it dependant upon the same process used to form the memory cells. In general, if the conductivity of the overall device is low, then the VGP created via the miniarray 108 will be low. A lower VGP means a lower rate of pulldown current will be created through the current limiter 140. In the end, this lower current will create a higher final voltage on the source node after the pulldown has occurred. In FIG. 2 this is shown by the portion 230 of the NS signal. The controlled pulldown of the source will come at a relatively slower rate which will assist in programming a memory cell with a relatively lower conductivity. In general, the requisite drain-to-source differential is needed for a longer period of time in order to allow for programming of the cell. Conversely, if the overall device conductivity is high, then the created VGP will also be high, and the pulldown rate will be relatively greater.

A simplified example is as follows: referring now to FIG. 3(a), a floating gate memory cell device 240 is shown with its drain, source, and gates nodes labeled D, S, and G respectively. A current limiter 242 is shown coupled to source node, and is used to pull down the source node of the device. It is intended that this device 240 can be implemented as per the circuitry described above in order to achieve a controlled pulldown rate on the source, with the rate being a function of the mirror current Ir. In this instance, the conductivity of the cell is low, and as described above, the miniarray, current mirror, and biasing circuit will serve to provide a lower VGP, and hence a lower pulldown rate. FIG. 3(b) shows a diagram of the source voltage NS being pulled down from an initial high level 243 at the pulldown point 244. The pulldown rate 246 is slower as a function of the lower Ir. The final source voltage after pulldown, shown as 248, is relatively higher because of the lower Ir.

A high conductivity example is shown in FIGS. 4(a) and 4(b). FIG. 4(a) shows a similar floating gate memory cell device 260 with drain (D), source (S), and gate (G) nodes labeled respectively. A current limiter 262 is shown coupled to the source node, and is also used to pull down the source node of the device. In this instance, the conductivity of the cell is high, and the circuitry described above will provide a higher VGP, and hence a higher pulldown rate. FIG. 4(b) shows a diagram of the source voltage NS being pulled down from an initial high level 263 at the pulldown point 264. The pulldown rate 266 is relatively faster as a function of the higher Ir. The final source voltage after pulldown, shown as 268, is relatively lower than that shown in FIG. 3(b) because of the higher Ir.

Accordingly, the process variations which might affect formation and conductivity of the memory cells can be used to similarly affect the devices which generate the rate of the pulldown current on the source of the memory device. The devices described in the present invention can therefore be configured to provide advantageous source pulldown rates, which are compensated for according to the cell conductivity condition.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. Circuitry for providing a controlled rate of programming current through a programmable memory cell device, the memory cell device being selectable for programming from a arranged collection of similar such devices, each memory cell device having a respective drain, source, and gate node, the circuitry comprising:

a current mirror device coupled to a current source device, the current mirror device producing a mirror current level defined by an input stimulus applied to the current source device;

a voltage biasing device coupled to the current mirror device, the voltage biasing device producing a biasing voltage with a level which is proportional to the mirror current level; and a current limiter device coupled to the source node of the selected memory cell, the current limiter device being driven by the biasing voltage and producing a limiter current which is directly proportional to the mirror current level, wherein the current limiter device is used to pull down the source node of the memory cell device at a controlled rate according to the mirror current.

2. The circuitry of claim 1, wherein the current source device is comprised of a miniarray device having drain, source, a gate nodes, and a known voltage is applied to the gate node as the input stimulus for generating a mirror current.

3. The circuitry of claim 2, wherein the miniarray device is formed during the same process as the memory cells and therefore has similar device conductivity.

4. The circuitry of claim 3, wherein a lower device conductivity in the memory cells and in the miniarray will result in a lower mirror current for a given input stimulus to the miniarray, the lower mirror current resulting in a proportionally lower biasing voltage, which results in a proportionally lower current limiter current for pulling down the source node of the memory cell.

5. The circuitry of claim 3, wherein a higher device conductivity in the memory cells and in the miniarray will result in a higher mirror current for a given input stimulus to the miniarray, the higher mirror current resulting in a proportionally higher biasing voltage, which results in a proportionally higher current limiter current for pulling down the source node of the memory cell.

6. The circuitry of claim 1, wherein the current mirror, voltage biasing, and memory cell devices are configured from N and P-type MOS devices.

7. A method for programming a non-volatile selectable memory cell device with drain, source, and gate nodes, the memory cells selectably arranged with a wordline coupled to the gate node and a dataline coupled to the drain node, the memory device having accompanying circuitry including a current mirror coupled to a current source and producing a current mirror current, a voltage biasing circuit coupled to produce a biasing voltage proportional to the mirror current, a current limiter coupled to the source node of the memory cell and being driven by the biasing voltage, the method comprising the steps of:

coupling the drain and source nodes of the selected memory cell device to a high voltage level to produce a small drain-to-source voltage differential;

coupling the gate node of the selected memory cell device to a certain voltage level;

coupling the dataline of the selected memory cell device to a high voltage level;

pulling down the source node of the memory cell at a controlled rate dependant upon a pre-defined level; and coupling the gate node of the selected memory cell device to a final programming level.

8. The method of programming a non-volatile selectable memory cell device of claim 7, wherein the step of pulling down the source node of the memory cell at a controlled rate dependant upon a pre-defined level includes the following steps:

(i) activating the current source coupled to the current mirror to produce a defined current mirror current;

(ii) using the biasing circuit to produce biasing voltage proportional to the current mirror current; and (iii) using the biasing circuit voltage to produce a current limiter current proportional to the current mirror current, wherein the current limiter pulls down the source node.

9. The method of programming a non-volatile selectable memory cell device of claim 7, wherein the last step of coupling the gate node includes coupling the gate node to a final programming level which is a step increase from the previous level applied to the gate node.

10. The method of programming a non-volatile selectable memory cell device of claim 7, wherein the last step of coupling the gate node includes coupling the gate node to a final programming level which is a time-dependant increase from the previous level applied to the gate node.

11. The method of programming a non-volatile selectable memory cell device of claim 10, wherein the time-dependant increase is a ramp increase from the previous level applied to the gate node.

12. The method of programming a non-volatile selectable memory cell device of claim 7, which includes a prior step of forming the current source device and memory cell devices so that process variations which affect device conductivity are common to both.

13. The method of programming a non-volatile selectable memory cell device of claim 12, wherein the current source current is set to a pre-defined level which varies proportionally from low to high as the conductivity of the formed devices varies from low to high.

* * * * *